United States Patent
Zaitsu et al.

(10) Patent No.: US 8,136,212 B2
(45) Date of Patent: Mar. 20, 2012

(54) METHOD OF FABRICATING STRUCTURE HAVING OUT-OF-PLANE ANGULAR SEGMENT

(75) Inventors: Yoshitaka Zaitsu, Kawasaki (JP); Chienliu Chang, Kawasaki (JP); Masao Majima, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 1022 days.

(21) Appl. No.: 12/061,512

(22) Filed: Apr. 2, 2008

(65) Prior Publication Data

US 2008/0289182 A1    Nov. 27, 2008

(30) Foreign Application Priority Data

Apr. 4, 2007    (JP) .................................. 2007-098294

(51) Int. Cl.
*H04R 17/00*    (2006.01)
(52) U.S. Cl. .............. 29/25.35; 29/594; 29/852; 29/829
(58) Field of Classification Search .................... 29/594, 29/25.35, 829, 852
See application file for complete search history.

(56) References Cited

U.S. PATENT DOCUMENTS

| 6,526,198 | B1 * | 2/2003 | Wu et al. .......................... 385/18 |
| 7,085,122 | B2 | 8/2006 | Wu et al. |
| 7,089,666 | B2 | 8/2006 | Kim et al. |
| 7,959,843 | B2 * | 6/2011 | Zaitsu et al. .................. 264/320 |

FOREIGN PATENT DOCUMENTS

JP    2004-219839 A    8/2004

\* cited by examiner

*Primary Examiner* — Derris Banks
*Assistant Examiner* — Azm Parvez
(74) *Attorney, Agent, or Firm* — Canon USA Inc IP Division

(57) ABSTRACT

A structure fabricating method plastically deforms a target portion of a substrate, to thereby fabricate a structure having an inclined segment that is inclined relative to a principal surface of the substrate. The method includes forming a projection on the target portion to project from the principal surface of the substrate or from an opposing surface of the substrate on the side opposite to the principal surface, and applying a force to the projection to plastically deform the target portion such that the target portion is bent in a direction from one surface of the substrate on the side where the projection is formed, toward another surface on the side opposite to the one surface.

11 Claims, 17 Drawing Sheets

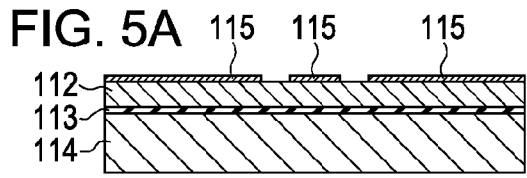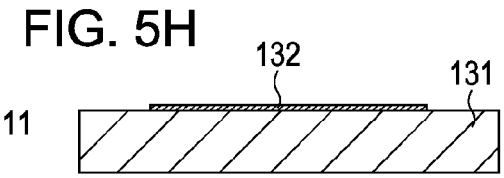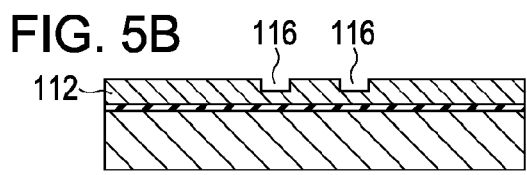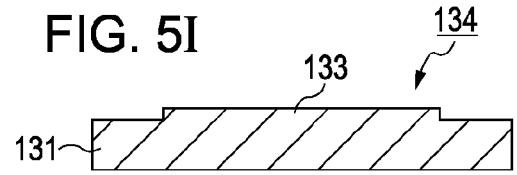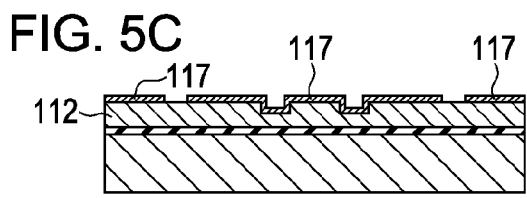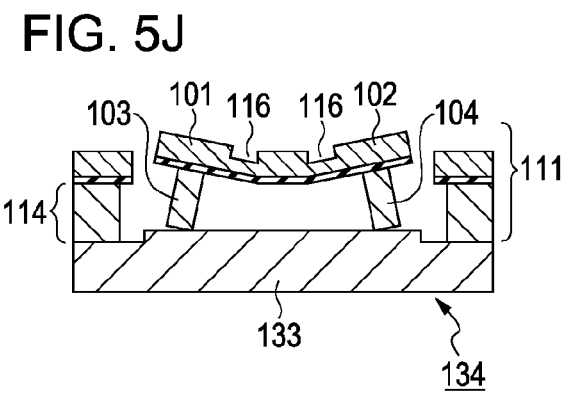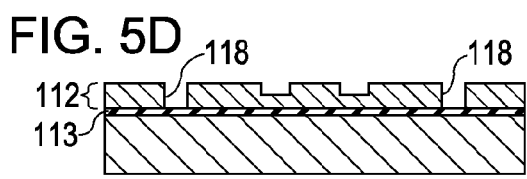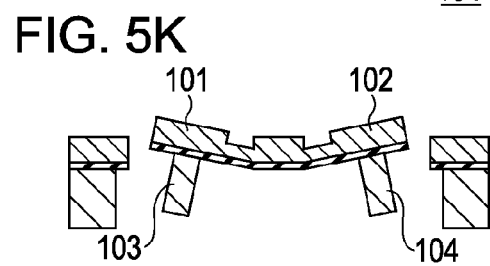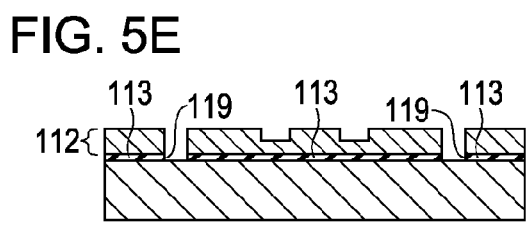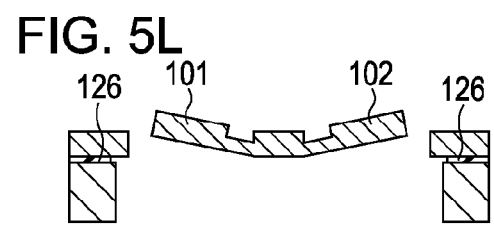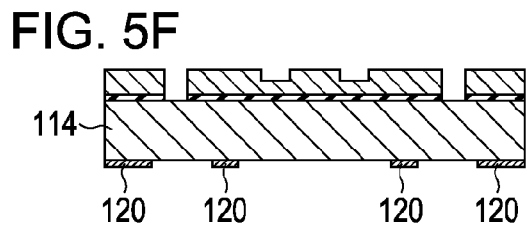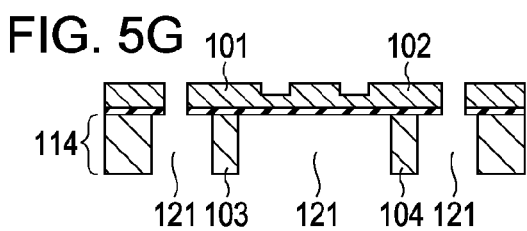

FIG. 6A1
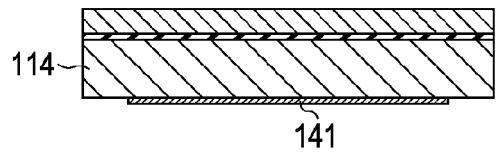
FIG. 6B1
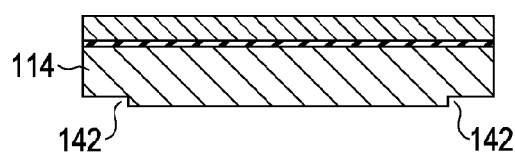
FIG. 6C1
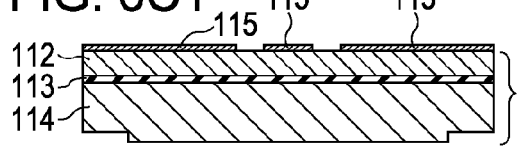
FIG. 6D1
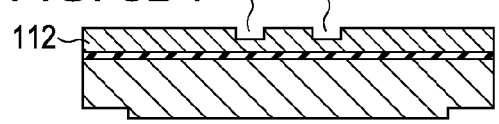
FIG. 6E1
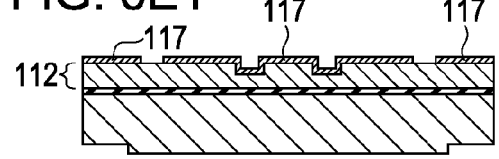
FIG. 6F1
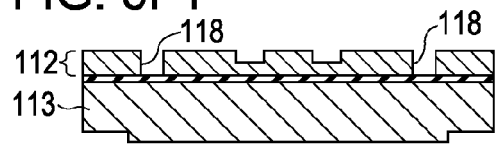
FIG. 6G1
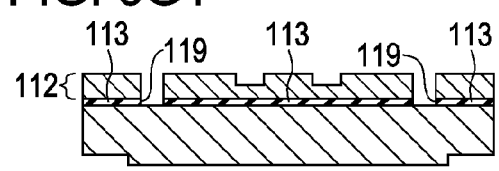
FIG. 6H1
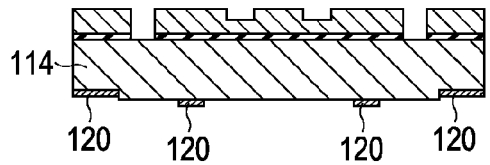
FIG. 6I1
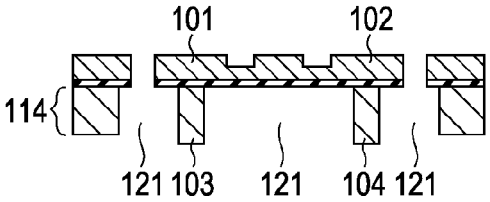
FIG. 6J1
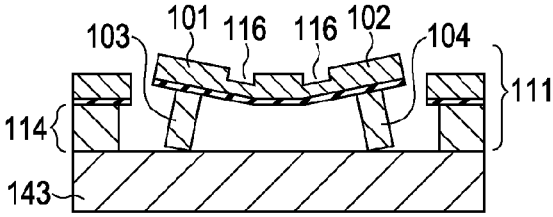
FIG. 6K1
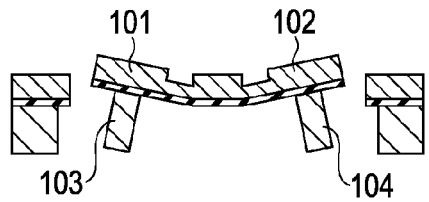
FIG. 6L1
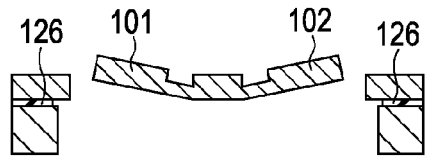

FIG. 8A2
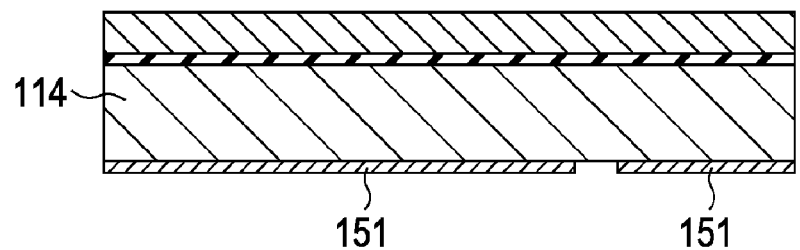
FIG. 8B2
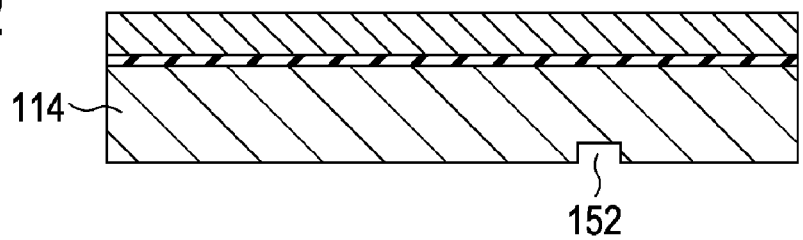
FIG. 8C2
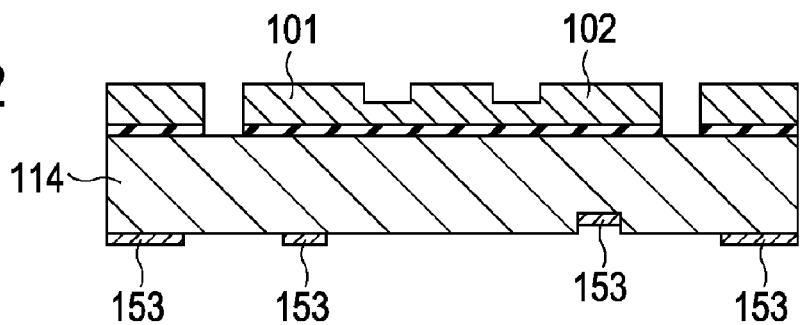
FIG. 8D2
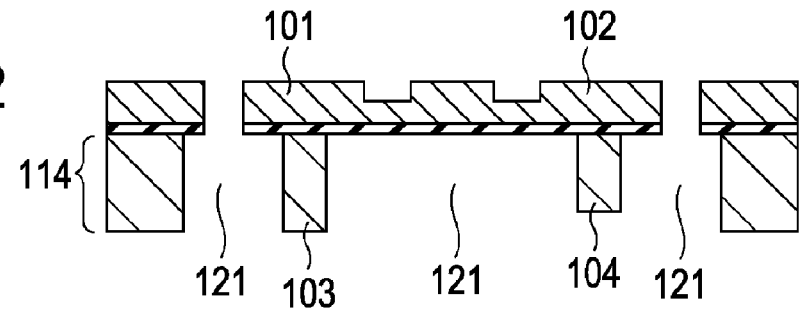

FIG. 9A3
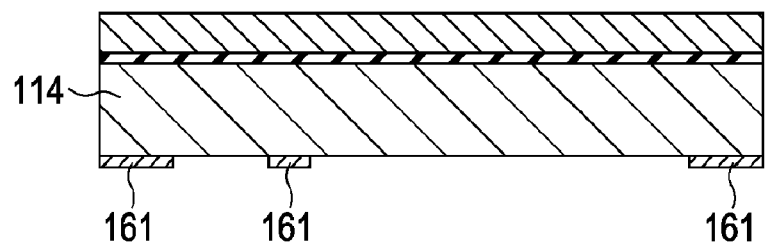
FIG. 9B3
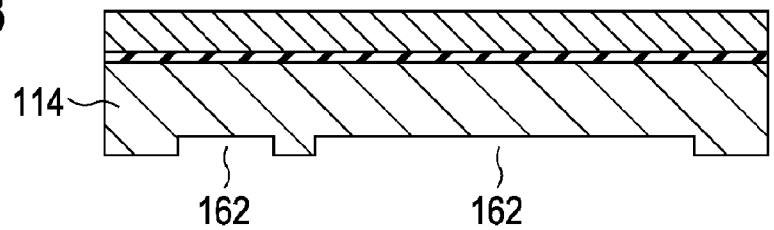
FIG. 9C3
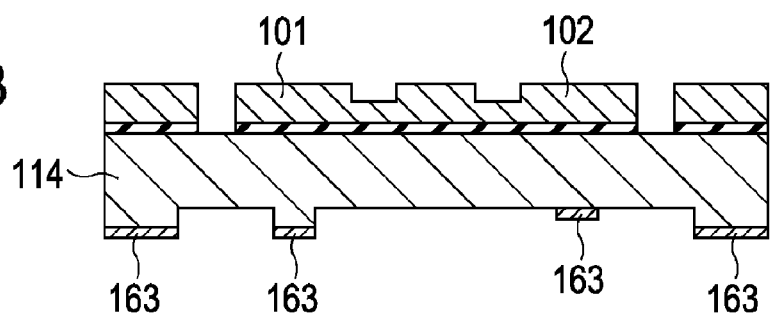
FIG. 9D3
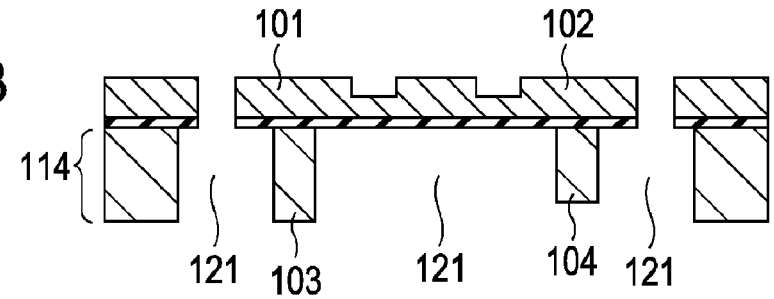

METHOD OF FABRICATING STRUCTURE HAVING OUT-OF-PLANE ANGULAR SEGMENT

BACKGROUND OF THE INVENTION

1. Field of the Invention

The present invention relates to a method of fabricating a structure having a beam-like structure that is represented by a comb structure for use in, e.g., a sensor and an actuator manufactured by the MEMS (Micro Electric Mechanical Systems) technique, for example.

2. Description of the Related Art

The term "VC (Vertical Comb) structure" means a structure in which a pair of comb tooth segments of a comb structure are arranged in an interdigitaing relation and one of the comb tooth segments is supported by an elastic member to be displaceable in an out-of-plane direction. Such a structure can be fabricated as a very fine structure with one comb tooth having a width of 5 µm, for example, by employing the micromachining technique called MEMS, which is based on the semiconductor fabrication technique.

The VC structure fabricated by the MEMS is employed in, e.g., a micromirror for conversion of an optical path and a variable capacitor in radio communication equipment. As one practical example, the VC structure can be used as an electrode of an electrostatic comb actuator including an oscillating microstructure which is driven by an electrostatic force.

In the electrostatic comb actuator using the VC structure, a large driving force is required to be generated to displace the comb structure from its initial position. In view of such a requirement, an AVC (Angular Vertical Comb) structure and a method of fabricating the AVC structure are proposed to provide a comb structure capable of increasing the driving force. (See Japanese Patent Laid-Open No. 2004-219839, U.S. Pat. No. 7,085,122, and U.S. Pat. No. 7,089,666.)

An example of the AVC structure will be described below with reference to FIGS. 14A-14C.

In the AVC structure of FIGS. 14A-14C, as viewed from above, a pair of comb tooth segments 301 and 302 (each having teeth) of a comb structure 300 is arranged to interdigitate with each other as shown in FIG. 14A. Also, as viewed from side, one (302) of the comb tooth segments 301 and 302 is arranged inclined so as to be located out of a plane with respect to the other (301) of the comb tooth segments (i.e., out-of-plane arrangement), as shown in FIG. 14B, which is a sectional view taken along a line XIVB-XIVB in FIG. 14A. When a voltage is applied between the comb tooth segments 301 and 302, the inclined comb tooth segment 302 is attracted toward the comb tooth segment 301 by an electrostatic force. Then the inclined comb tooth segment 302 and an oscillating plate 304 are displaced in a direction to rotate about a torsion spring 303, as shown in FIG. 14C, which is a sectional view taken along a line XIVC-XIVC in FIG. 14A.

Known methods of fabricating the AVC structure are as follows:

1. A notch is formed in a comb tooth segment of a comb structure and a resin is filled in the notch. Thereafter, the comb structure is pressed against a die to bend the comb tooth segment. The resin is then cured to fixate the notch in the bent state. (See Japanese Patent Laid-Open No. 2004-219839)

2. After forming a resin portion on a comb tooth segment under an environment at temperature higher than room temperature, the resin portion is cooled to room temperature such that the comb tooth segment is bent by tension generated due to the difference in thermal contraction between the resin and the material of the comb tooth segment. (See U.S. Pat. No. 7,085,122)

3. A comb tooth segment is fabricated by using an elastic material (e.g., single-crystal silicon) that exhibits plasticity at high temperatures. The comb tooth segment is then pressed against a die at a high temperature to plastically deform it. (See U.S. Pat. No. 7,089,666)

The above fabricating method (1) will be briefly described with reference to FIGS. 15A-15C.

An AVC structure 310 according to method (1) is constructed as shown in FIG. 15A. The AVC structure 310 has a pair of comb tooth segments 311 and 316. A support substrate 312 of the comb tooth structure 311 has a notch 313, as shown in FIG. 15B, which is a sectional view taken along a line XVB-XVB in FIG. 15A.

The comb tooth segment 311 is inclined in the following manner. The support substrate 312 is pressed against a die 314 having a slope in order to incline the comb tooth segment 311 by bending the support substrate 312 at the notch 313 together with the comb tooth segment 311, as shown in FIG. 15C, which is a sectional view taken along a line XVC-XVC in FIG. 15A. A reinforcing member 315 made of, e.g., a resin is filled in the notch 313 such that the bent portion is reinforced.

The above fabricating method (2) will be briefly described with reference to FIGS. 16A-16C.

An AVC structure 320 according to the method (2) is constructed as shown in FIG. 16A. The AVC structure 320 has a pair of comb tooth segments 321 and 324. The comb tooth segment 321 is coupled to a support 323 through a hinge 322. The hinge 322 is made of a resin material that is curable under heating.

A manner of inclining the comb tooth segment 321 is illustrated in FIGS. 16B and 16C, which are sectional views respectively taken along lines XVIB-XVIB and XVIC-XVIC in FIG. 16A. First, as shown in FIG. 16B, the hinge 322 made of the above-described resin material is formed between the comb tooth segment 321 and the support 323. Then, the hinge 322 is heated to be cured. The resin undergoes contraction with the progress of curing such that an upper surface of the comb tooth segment 321 is pulled toward the support 323. Based on the contraction curing of the resin material, the comb tooth segment 321 is fixedly held in an inclined state as shown in FIG. 16C.

The above fabricating method (3) will be briefly described with reference to FIGS. 17A-17C.

An AVC structure 330 according to the method (3) is constructed as shown in FIG. 17A. The AVC structure 330 has a pair of comb tooth segments 331 and 336. The comb tooth segment 331 is on one side of an oscillating plate 333 that is supported by a torsion spring 332 and that is able to oscillate in a rotating direction. The torsion spring 332 is made of a material capable of being elastically deformed under heating, such as single-crystal silicon.

A manner of inclining the comb tooth segment 331 is illustrated in FIGS. 17B and 17C, which are sectional views respectively taken along lines XVIIB-XVIIB and XVIIC-XVIIC in FIG. 17A.

As shown in FIG. 17B, a die 335 having a pillar 334 is pressed against the oscillating plate 333 in the direction indicated by a straight arrow and is then heated in a state that the pillar 334 contacts an upper surface of one portion of the oscillating plate 333 on the side opposite to the other portion including the comb tooth segment 331. With the pressing, the oscillating plate 333 is rotated in the direction indicated by a curved arrow, and the torsion spring 332 is plastically deformed into such a shape as holding a certain rotational angle of the oscillating plate 333. Then, the die 335 is removed after cooling. As a result, the oscillating plate 333 is held in the inclined state as shown in FIG. 17C, and the comb tooth segment 331 formed laterally of the oscillating plate 333 is also held in the inclined state together with the oscillating plate 333.

In a structure including a structural segment that is angled relative to a plane parallel to the principal surface of a substrate, it is desired that the angular segment be fabricated so as to incline to match with the designed angle at high accuracy.

With the fabricating method disclosed in Japanese Patent Laid-Open No. 2004-219839 and U.S. Pat. No. 7,085,122, however, control of a bending angle is difficult because the bending angle of the comb tooth segment depends on not only the density and the amount of each of the resins used as materials of the reinforcing member and the hinge, but also the curing temperature and environmental conditions such as an ambient atmosphere. Further, because the thermal expansion coefficient and the amount of moisture absorption of the resin material are larger than those of silicon that is a main material of the comb tooth segment, the bending angle of the comb tooth segment after the fabrication is susceptible to change depending on external environmental conditions such as temperature and humidity.

The fabricating method disclosed in U.S. Pat. No. 7,089,666 has a high probability that, when the pillar is pressed against the oscillating plate, a pressing position is deviated from the designed position. If a deviation occurs, the desired angle is difficult to obtain.

SUMMARY OF THE INVENTION

The present invention is directed to a structure fabricating method which can easily control a bending angle, can bend a structural segment to be inclined at an arbitrary angle, and can determine the bending angle only depending on geometrical conditions.

According to the present invention, in a structure fabricating method of plastically deforming a target portion of a substrate, to thereby fabricate a structure having an inclined segment that is inclined relative to a principal surface of the substrate, the method includes forming a projection on the target portion to project from the principal surface of the substrate or from an opposing surface of the substrate on the side opposite to the principal surface, and applying a force to the projection to plastically deform the target portion such that the target portion is bent in a direction from one surface of the substrate on the side where the projection is formed, toward another surface on the side opposite to the one surface.

The term "principal surface" used in this specification means a surface having a maximum area among surfaces constituting a substrate, and it represents one of a front surface and a rear surface of a substrate. When one of the front surface and the rear surface is called the principal surface, the other surface is a surface on the side opposite to the principal surface. Assuming, for example, a plate-like substrate (e.g., a silicon wafer) that is generally used in the MEMS technique, one of a front surface and a rear surface of the substrate, each having a large area, is a principal surface and the other is a surface on the side opposite to the principal surface.

The term "plane parallel to the principal surface" means a plane including the principal surface before bending (i.e., a flat surface in which the inclined portion is not yet provided), and it is an imaginary plane used for explaining the bending.

As compared with the method disclosed in U.S. Pat. No. 7,089,666 cited above as the related art, the present invention has the following advantages in control of the bending angle of a target portion to be bent.

With reference to schematic drawings (FIGS. 12 and 13), a description is comparatively made of components related to the control of the bending angle of the target portion to be bent, when the method disclosed in U.S. Pat. No. 7,089,666 is used and when the method of the present invention is used.

FIG. 12 is a schematic view illustrating the components related to the control of the bending angle of the target portion to be bent, when the structure fabricating method disclosed in U.S. Pat. No. 7,089,666 is used. Figures drawn by dotted lines represent respective positions of a target portion 401 to be bent and a pillar 402 immediately before the target portion 401 is deformed and bent in the direction indicated by a curved arrow in FIG. 12. When the target portion 401 is bent by the method according to U.S. Pat. No. 7,089,666, it is assumed that an amount by which the pillar 402 is pushed up in the direction indicated by a straight arrow in FIG. 12 is d. It is also assumed that s represents a length from the position of a base point P where the target portion 401 is bent to a point Q where the pillar 402 contacts the target portion 401 before the target portion 401 is bent. As seen from FIG. 12, a bending angle θ of the target portion 401 is determined by the following formula (1):

$$\tan\theta = \frac{d}{s} \qquad (1)$$

The accuracy of the amount d by which the pillar 402 is pushed up depends on the micromachining accuracy in shapes of respective parts at which a structure having the target portion 401 abuts against a die having the pillar 402. On the other hand, the distance s from the base point P to the point Q depends on the accuracy of alignment between the structure and the die. Accordingly, it is understood from the formula (1) that the accuracy of the bending angle θ of the target portion 401 depends on not only the micromachining accuracy in shapes of the structure and the die, but also the accuracy of the alignment between the structure and the die.

FIG. 13 is a schematic view illustrating the components related to the control of the bending angle of the target portion to be bent, when the structure fabricating method according to the present invention is used. Figures drawn by dotted lines represent respective positions of a target portion 411 to be bent and a projection 412 of the target portion 411 immediately before the target portion 411 is deformed and bent in the direction indicated by a curved arrow in FIG. 13. When the target portion 411 is bent by the method according to the present invention, it is assumed that an amount by which the projection 412 of the target portion 411 is pushed up in the direction indicated by a straight arrow in FIG. 13 is d. It is also assumed that r represents a distance from a base point P where the target portion 411 is bent to a point R corresponding to the root of the projection 412 of the target portion 411, and L represents a length of the projection 412 of the target portion 411. As seen from FIG. 13, the relationship among a bending angle θ of the target portion 411, d, r and L is expressed by the following formula (2):

$$\sin(\theta - \alpha) = -\frac{L-d}{\sqrt{L^2 + r^2}} \left[ \text{where } \alpha = \tan^{-1}\left(\frac{L}{r}\right) \right] \quad (2)$$

The accuracy of each of the amount d by which the projection 412 of the target portion 411 is pushed up, the distance r from the base point P to the point R, and the length L of the projection 412 of the target portion 411 depends on the micromachining accuracy in shapes of a structure and a die, the structure having the target portion 411, and the projection 412 of the target portion 411. Accordingly, it is understood from the formula (2) that the accuracy of the bending angle θ of the target portion 411 depends on only the micromachining accuracy in shapes of the structure and the die.

Generally, when the alignment between the structure and the die is performed by applying pressure while pressing the die against the structure, the accuracy of the alignment is lower than the micromachining accuracy of the structure and the die. In the case of using the method according to U.S. Pat. No. 7,089,666, the accuracy of the alignment between the structure and the die prominently affects the bending angle θ of the target portion. By contrast, in the case of using the method according to the present invention, the accuracy of the alignment between the structure and the die does not affect the bending angle θ of the target portion.

Thus, the method according to the present invention can improve the accuracy of the bending angle θ of the target portion in comparison with the method according to U.S. Pat. No. 7,089,666.

With the method of fabricating the structure including a structural segment that is angled relative to a plane parallel to the primary surface of the substrate, according to the present invention, the projection is formed on the structural segment to be inclined (i.e., on the target portion).

Therefore, a force can be applied to a desired position on the target portion.

Further, since resin or the like is not used when the target portion is bent, not only effects of the density and the amount of the resin, but also effects of external environments such as temperature and humidity can be reduced.

As a result, when the bending angle is practically set, the target portion can be fabricated at the desired bending angle with high accuracy just depending on geometrical conditions.

In other words, by carrying out the present invention, the target portion can be formed at the desired bending angle with high accuracy. For example, when a structure, such as an AVC structure, is fabricated, comb teeth can be formed while controlling the bending of the comb teeth with higher accuracy than the known methods.

Further features of the present invention will become apparent from the following description of exemplary embodiments with reference to the attached drawings.

BRIEF DESCRIPTION OF THE DRAWINGS

FIGS. 5A-5L are schematic views illustrating steps of a structure fabricating method according to a first exemplary embodiment of the present invention.

FIGS. 6A1-6L1 are schematic views illustrating a part of steps of a modified structure fabricating method according to the first exemplary embodiment of the present invention.

FIGS. 8A2-8D2 are schematic views illustrating a part of steps of a structure fabricating method according to a second exemplary embodiment of the present invention.

FIGS. 9A3-9D3 are schematic views illustrating a part of steps of a modified structure fabricating method according to the second exemplary embodiment of the present invention.

DESCRIPTION OF THE EMBODIMENTS

Figure 1A:
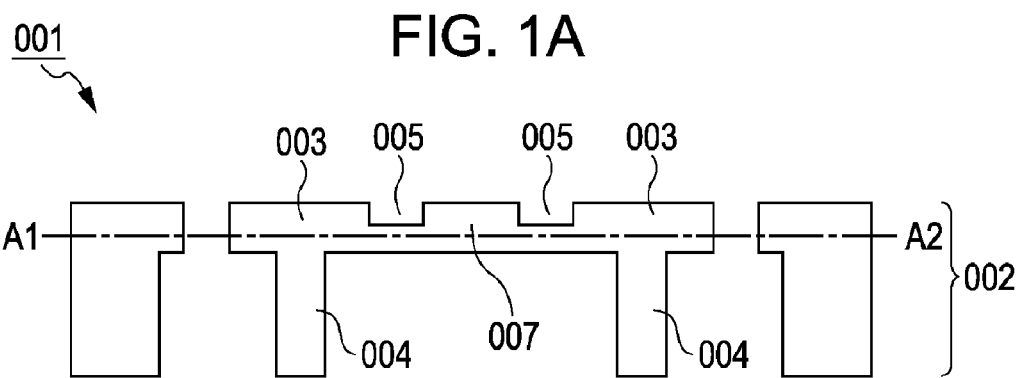
FIGS. 1A and 1B are schematic views illustrating steps of a structure fabricating method according to a basic concept of the present invention.
Figure 1B:
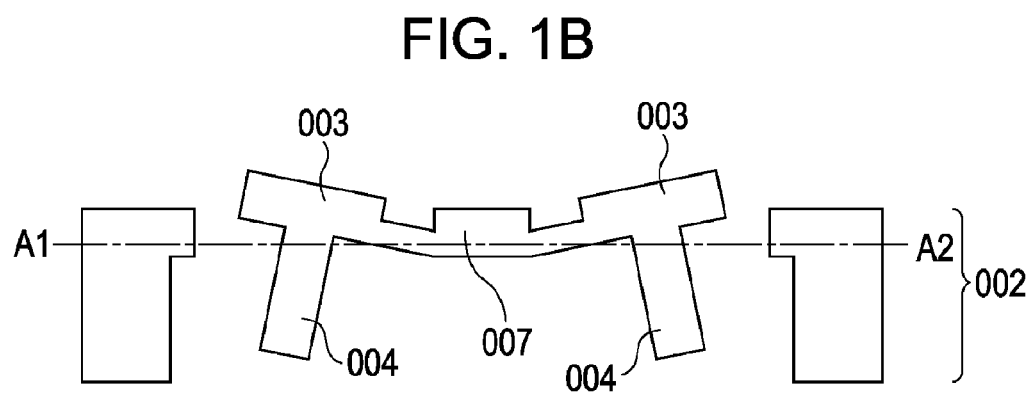

The basic concept of a method of fabricating a structure having a structural segment, which is angled relative to a plane parallel to a principal surface of a substrate, according to the present invention, will be described below with reference to FIGS. 1A and 1B.

The method of fabricating a structure having a structural segment, which is angled relative to a plane parallel to a principal surface of a substrate, according to the present invention, includes mainly the following two steps (a) and (b).

(a) A substrate 002 is subjected to micromachining to fabricate a structure 001.

In the above step, the structure 001 has a structural segment (hereinafter also referred to as a "target portion") 003 to be bent to incline outward of a plane (indicated by a one-dot-chain line A1-A2 in FIGS. 1A and 1B) that is parallel to a principal surface of the substrate 002. A projection 004 is provided on the target portion 003 so as to project in a direction crossing the plane that is parallel to the principal surface of the substrate 002 (i.e., the principal surface before the bending). Herein, the principal surface of the substrate 002 means one of surfaces of the substrate 002 at which the micromachining is mainly performed.

In order to facilitate plastic deformation of the target portion 003, the substrate 002 can be micro-machined at a position from which the plastic deformation is to be started. For example, a recess 005 can be formed at such a position so that the strength of the substrate 002 is weakened there in comparison with the surrounding area.

(b) The target portion 003 is plastically deformed by applying a force to the projection 004 that is provided on the target portion 003.

A method of applying the force is not limited to a particular one so long as the target portion 003 can be inclined outward of the plane (indicated by the one-dot-chain line A1-A2 in FIGS. 1A and 1B) that is parallel to the principal surface of the substrate 002. For example, the projection 004 of the target portion 003 can be pushed up or pulled up. Alternatively, a pair of projections 004 of the target portion 003 can be pushed in a direction to spread or narrow. Thus, suitable one of various methods can be used which enable the target portion 003 to be plastically deformed by applying a force to the projection 004 of the target portion 003.

Further, in order to facilitate the plastic deformation of the target portion 003, the target portion 003 can be partly or entirely heated. The heating can be made at proper timing before the target portion 003 is deformed or during a period in which the target portion 003 is being deformed.

Figure 2A:
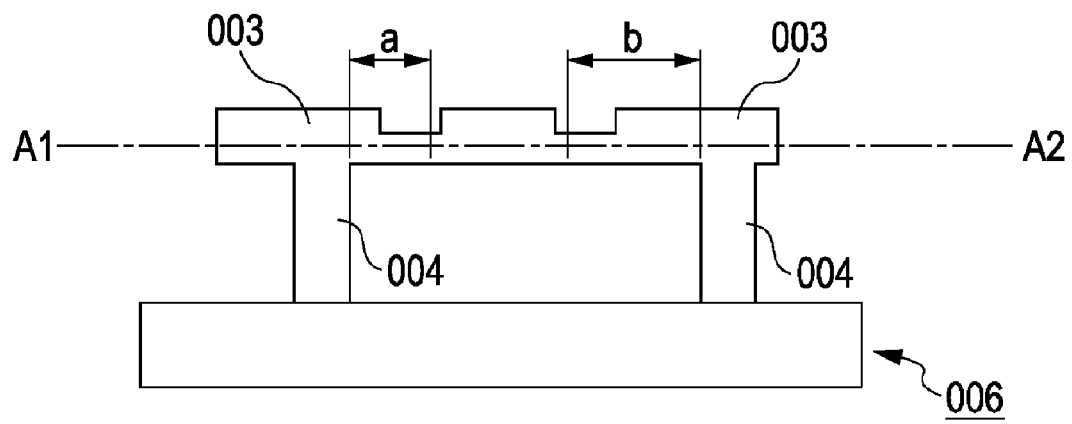
FIGS. 2A and 2B are schematic views illustrating steps of the structure fabricating method according to the basic concept of the present invention.
Figure 2B:
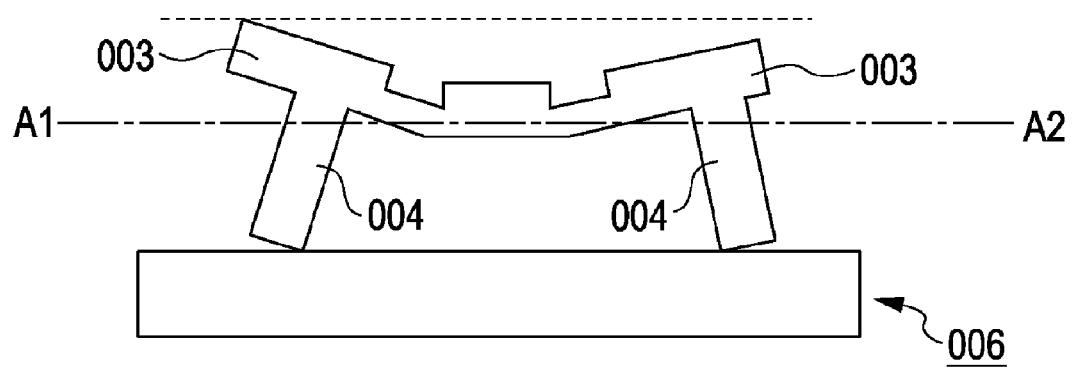
Figure 3A:
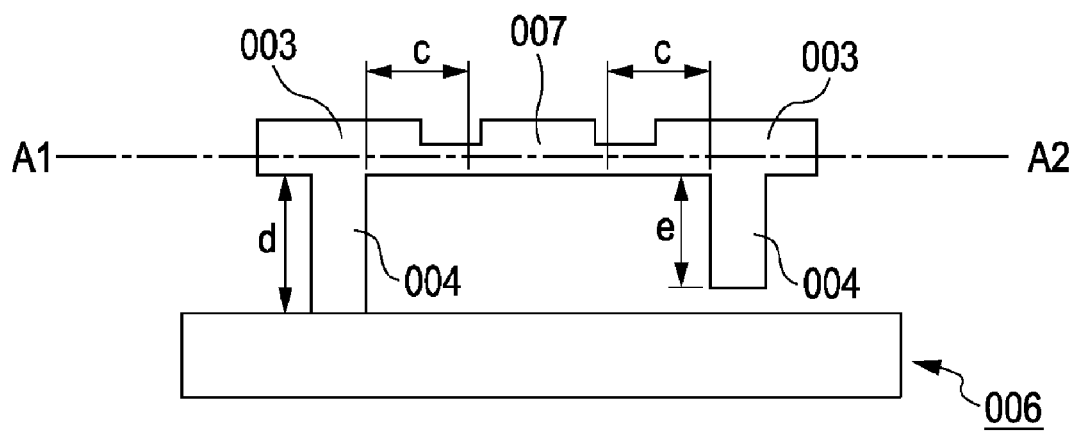
FIGS. 3A and 3B are schematic views illustrating steps of the structure fabricating method according to the basic concept of the present invention.
Figure 3B:
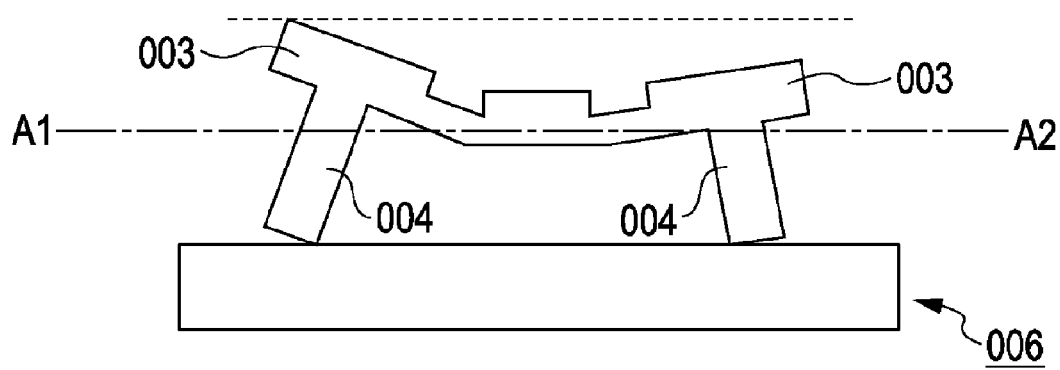

As shown in FIGS. 2A and 2B, when a die 006 is used in the step (b) to apply a force for pushing up the projection 004, angles at which two target portions 003 are inclined can be set different from each other by providing respective projections 004 of the target portions 003 in positions at different distances from respective start points of the plastic deformations. Alternatively, as shown in FIGS. 3A and 3B, the angles at which two target portions 003 are inclined can also be changed by changing respective lengths of the projections 004 of the target portions 003.

By plastically deforming the target portion of the substrate in such a manner, a structure having an inclined portion, which is inclined relative to the principal surface of the substrate, can be fabricated.

In the above-described examples, the target portion 003 is extended out from a movable section 007 of the structure 001.

Figure 4A:
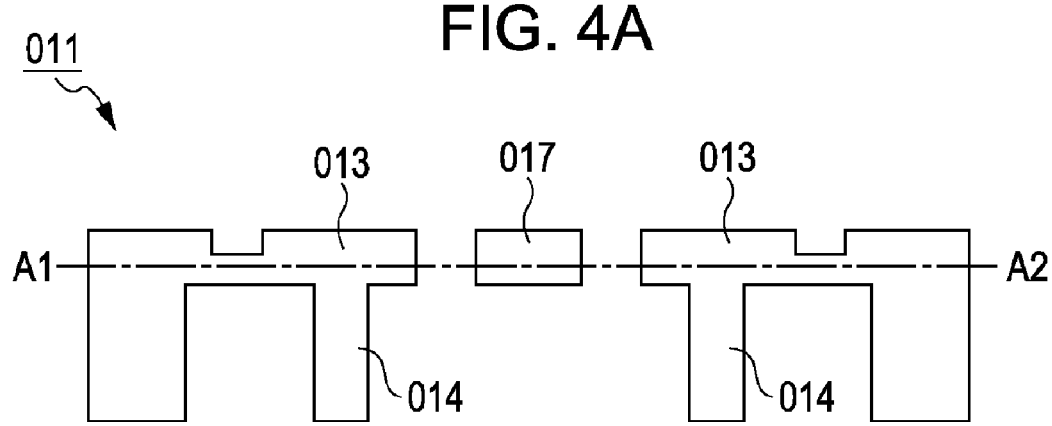
FIGS. 4A and 4B are schematic views illustrating steps of the structure fabricating method according to the basic concept of the present invention.
Figure 4B:
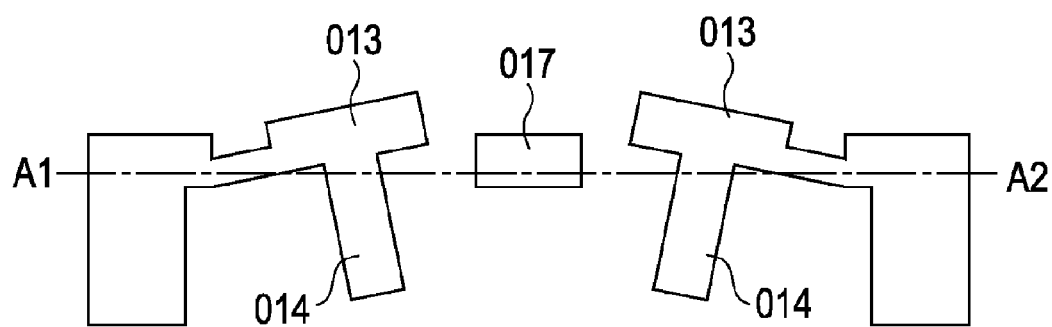

As shown in FIGS. 4A and 4B, a target portion 013 extending out from a support section 017 of a structure 011 can also be inclined similarly to the above-described examples by providing a projection 014 on the target portion 013.

Practical exemplary embodiments of the aforementioned structure fabricating method will be described below.

First Exemplary Embodiment

A first exemplary embodiment is described in connection with a method of fabricating a structure having an inclined segment, which is angled outward of a plane parallel to a principal surface of a substrate. It is, however, to be noted that the structure fabricating method is not limited to the illustrated exemplary embodiment.

FIGS. 5A-5L are schematic views illustrating steps of the structure fabricating method according to the first exemplary embodiment. FIGS. 5A-5L correspond respectively to steps (a) to (l).

First, target portions 101 and 102 to be inclined and projections 103 and 104 projecting respectively from the target portions 101 and 102 are formed through the following steps (a) to (g).

(a) A mask layer 115 is formed on the surface of a device layer 112 of a substrate 111.

The substrate 111 has a structure in which a layer of an insulating material is sandwiched between two layers. In this specification, those three layers are called a device layer 112, an insulating layer 113, and a support layer 114, respectively. The substrate 111 can be constituted by, e.g., a SOI (Silicon On Insulator) substrate in which the insulating layer 113 made of silicon dioxide is sandwiched between two layers (the device layer 112 and the support layer 114) that are each made of single-crystal silicon.

(b) Recesses 116 are formed in the device layer 112.

At that time, the length of each recess 116 in the direction of depth thereof is set smaller than the thickness of the device layer 112.

The recess 116 can be formed, for example, by the vertical etching technique such as reactive ion etching. The depth of the recess 116 can be controlled depending on the length of an etching time.

(c) A mask layer 117 is formed on the surface of the device layer 112.

(d) Through holes 118 are formed in the device layer 112.

Similarly to the formation of the recesses 116, the through holes 118 can be formed, for example, by the vertical etching technique such as reactive ion etching. In the case of using the reactive ion etching, the through holes 118 can be reliably formed by using, as an etching gas, gas that is hard to react with the insulating layer 113 of the substrate 111.

(e) Through holes 119 are formed in the insulating layer 113 with the device layer 112 used as a mask.

For example, when the SOI substrate is employed as the substrate 111, only the insulating layer 113 can be etched by using an etchant or etching gas, e.g., hydrofluoric acid or carbon tetrafluoride gas, which is able to selectively etch silicon dioxide.

(f) A mask layer 120 is formed on a lower surface of the support layer 114.

(g) Through holes 121 are formed in the support layer 114.

Next, a die 134 used for inclining the target portions 101 and 102 are fabricated by using another substrate 131 through the following steps (h) and (i).

Considering the fact that the die 134 is pressed against the substrate 111 and is heated as required, the die 134 can be made of a material having rigidity comparable to or greater than that of the substrate 111 and having a thermal expansion coefficient close to that of the device layer 112 of the substrate 111.

Further, when the substrate 111 is formed of the SOI substrate, the material of the substrate 131 can be silicon, i.e., the same as that of the device layer 112.

(h) A mask layer 132 is formed on an upper surface of the substrate 131.

(i) A die projection 133 is formed on the upper surface of the substrate 131.

The die projection 133 is formed by etching a portion of the upper surface of the substrate 131, which is positioned around the die projection 133, with the etching technique such as reactive ion etching.

Finally, the target portions 101 and 102 are inclined so as to have elevation angles and the projections 103 and 104 of the target portions 101 and 102 are removed through the following steps (j) to (l).

(j) The recesses 116 in the device layer 112 are plastically deformed by heating the recesses 116 and pressing the die 134 against the lower surface of the support layer 114 and against the projections 103 and 104 of the target portions 101 and 102.

For example, when the SOI substrate is employed as the substrate 111, the heating temperature is set equal to or higher than 600° C. that is required to plastically deform silicon. The heating can be performed, for example, by a method of supplying a current to flow through a current path that is formed so as to pass the surrounding of each recess 116, and locally heating the recess 116 and the surrounding thereof by Joule heat generated with the supply of the current. The current path can be formed by vapor deposition of a conductor thin film having a sufficiently high melting point while an appropriate insulating film is interposed between the device layer 112 and the conductor thin film, or by employing the device layer 112 itself when the device layer 112 has conductivity.

Alternatively, after bonding the substrate 111 and the die 134 to each other, the recesses 116 in the device layer 112 can be heated by heating the entirety of both the substrate 111 and the die 134 by using an appropriate heating furnace. For example, when the SOI substrate is employed as the substrate 111, the substrate 111 and the die 134 can be bonded to each other through the steps of forming a layer of silicon dioxide on an upper surface of the die 134 and bonding the lower surface of the substrate 111 to the upper surface of the die 134 by anodic bonding.

(k) After cooling, the die 134 is removed.

(l) The insulating layer 113 is removed except for a portion denoted as an insulating layer 126.

Because the projections 103 and 104 of the target portions 101 and 102 are fixed to the target portions 101 and 102 through only the insulating layer 113 interposed therebetween, the projections 103 and 104 of the target portions 101 and 102 are removed together with the insulating layer 113 in the step (l).

For example, when the SOI substrate is employed as the substrate 111, the insulating layer 113 can be removed by a method of etching only the insulating layer 113, i.e., a method using an etchant or etching gas, e.g., hydrofluoric acid or carbon tetrafluoride gas, which is able to selectively and isotropically etch silicon dioxide. On that occasion, by adjusting an etching time, a portion of the insulating layer 113 corresponding to the insulating layer 126 can be left while the insulating layer 113 near the projections 103 and 104 of the target portions 101 and 102 can be removed.

Further, when the substrate 111 and the die 134 are bonded to each other in the step (j) by anodic bonding with the layer of silicon dioxide interposed between them, the step (k) of removing the die 134 and the step (l) of removing the insulating layer 113 can be performed at the same time.

Instead of the above-described example, a substrate having a uniformly flat surface can also be used as the die for pushing up the projections of the target portions. FIGS. 6A1-6L1 illustrate a fabricating method in such a case.

The fabricating method of this modified example includes the following steps (a1) to (l1). FIGS. 6A1-6L1 correspond respectively to the steps (a1) to (l1).

(a1) A mask layer 141 is formed on a lower surface of the support layer 114.

(b1) A recess 142 is formed in the lower surface of the support layer 114.

The steps (c1) to (g1) are the same as the above-described steps (a) to (e) and a description of those steps is not repeated here.

(h1) A mask layer 120 is formed on the lower surface of the support layer 114.

(i1) A through hole 121 is formed in the support layer 114.

The steps (j1) to (l1) are substantially the same as the above-described steps (j) to (l) and a description of those steps is not repeated here.

With the fabricating method of this modified example, the projections 103 and 104 of the target portions 101 and 102 are allowed to contact the upper surface of the die 143 at any positions. Accordingly, when the die 143 is pressed against the substrate 111, there is no need for position alignment in the horizontal direction.

Figure 7:
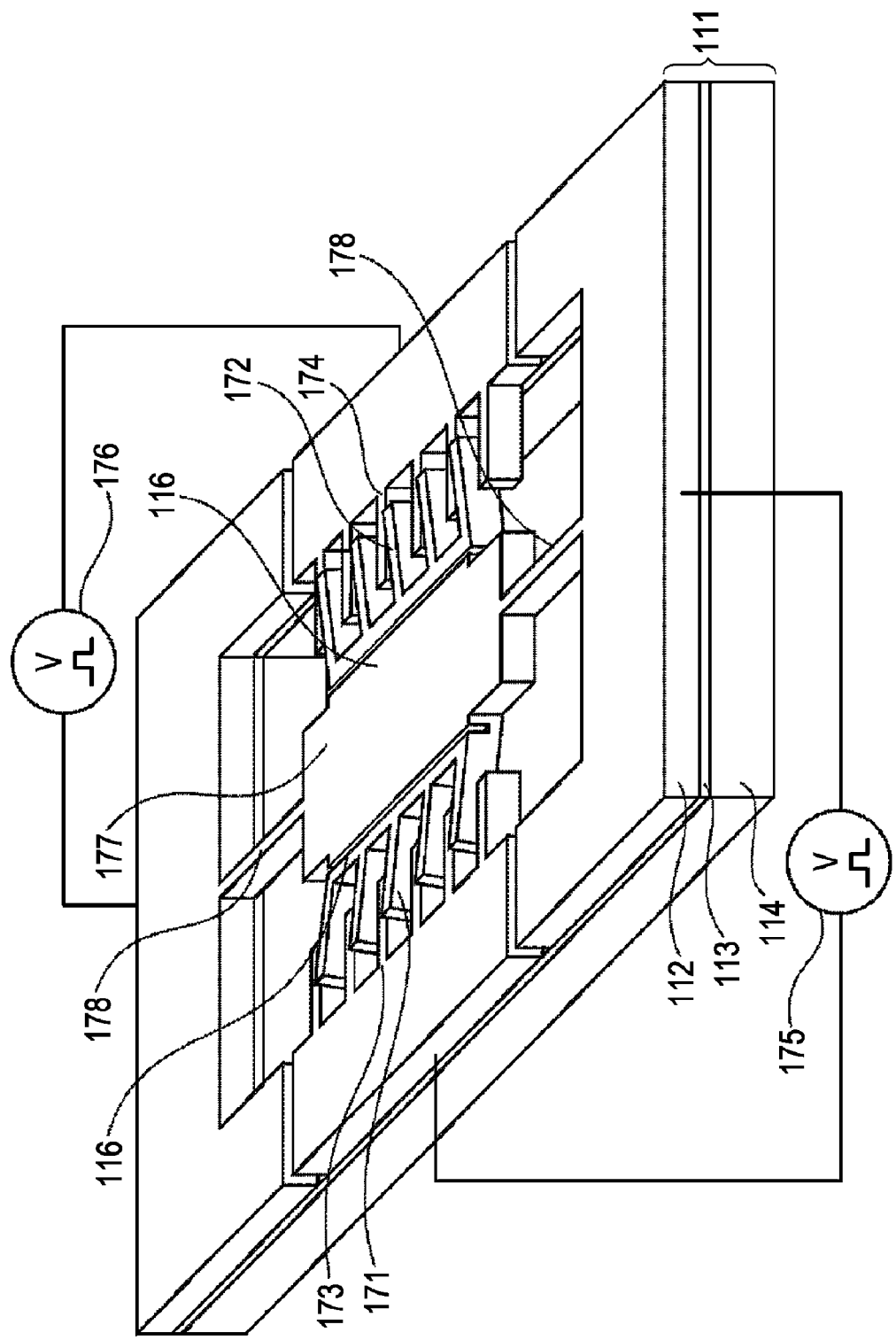
FIG. 7 is a perspective view illustrating one example of a structure fabricated by the structure fabricating method according to the first exemplary embodiment of the present invention.

FIG. 7 illustrates one example of the structure fabricated by the fabricating method of the first exemplary embodiment.

Specifically, FIG. 7 illustrates an oscillating structure in the form of an AVC structure having a plurality of movable comb teeth 171 and 172 that are inclined upward relative to a horizontal reference plane parallel to the principal surface of the substrate 111. An oscillating plate 177 can be oscillated in a direction to rotate about a torsion spring 178 by connecting a voltage signal source 175 and 176, which produces a voltage varying in the waveform of, e.g., pulses and a sine wave, between the movable comb teeth 171 and 172 and stationary comb teeth 173 and 174.

Second Exemplary Embodiment

By modifying a part of the steps in the first exemplary embodiment, a plurality of target portions can be inclined at different angles. Two examples of such a method are described in a second exemplary embodiment.

According to the first method, the projections 103 and 104 of the target portions 101 and 102 are formed in positions at different distances from the reference point for the bending of the target portions 101 and 102.

More specifically, a structure according to the first method can be fabricated by modifying the structure fabricating method of the first exemplary embodiment such that the areas where the through holes 121 are formed in the step (g) or (i1) are changed by changing the areas where the mask layers 120 are formed in the step (f) or (h1).

A state of the structure where the die 134 is pressed against the lower surface of the support layer 114 and against the projections 103 and 104 of the target portions 101 and 102 is similar to the state shown in FIG. 2B.

According to the second method, the projections 103 and 104 of the target portions 101 and 102 are formed at different lengths. The second method can be carried out as follows.

First, as shown in FIGS. 8A2 and 8B2, a mask layer 151 is formed on the lower surface of the support layer 114 while leaving a hole in consideration of the length and the position at which the projection 103 or 104 of the target portion 101 or 102 is to be formed, and a recess 152 is formed in the support layer 114. The depth of the recess 152 is set to a value obtained by subtracting the length of the to-be-formed projection 103 or 104 of the target portion 101 or 102 from the thickness of the support layer 114. In FIG. 8B2, the recess 152 is formed to set respective lengths of the projections 103 and 104 such that the length of the projection 104 of the target portion 102 is shorter than the thickness of the support layer 114, while the length of the projection 103 of the target portion 101 is equal to the thickness of the support layer 114. The recess 152 can be formed in a similar manner to that used in the step (b) (FIG. 5B) of the first exemplary embodiment for forming the recess 116 in the device layer 112.

Next, the device layer 112 and the insulating layer 113 are subjected to micromachining to form the target portions 101 and 102 to be inclined, i.e., the target portions 101 and 102 in a state before they are inclined. The micromachining of the device layer 112 and the insulating layer 113 can be performed in a similar manner to that in the steps (a) to (e) of the first exemplary embodiment.

Next, as shown in FIGS. 8C2 and 8D2, mask layers 153 are formed on the lower surface of the support layer 114 and through holes 121 are formed in the support layer 114. The through holes 121 can be formed in a similar manner to that in the step (g) of the first exemplary embodiment.

Subsequent steps, i.e., a step of fabricating the die 134, a step of inclining the target portions 101 and 102, and a step of removing the projections 103 and 104 of the target portions 101 and 102, can be performed in a similar manner to that in the steps (h) to (l) in the first exemplary embodiment. A state of the structure where the die 134 is pressed against the lower surface of the support layer 114 and against the projections 103 and 104 of the target portions 101 and 102 is similar to the state shown in FIG. 3B.

The projections 103 and 104 of the target portions 101 and 102, which have different lengths, can also be formed by employing steps shown in FIGS. 9A3-9D3 instead of the steps shown in FIGS. 8A2-8D2.

First, as shown in FIGS. 9A3 and 9B3, a mask layer 161 is formed on the underside of the substrate 111 (on the lower surface of the support layer 114), and a recess 162 is formed in the support layer 114. The depth of the recess 162 is set to a value obtained by subtracting the length of the to-be-formed projection 103 or 104 of the target portion 101 or 102 from the thickness of the support layer 114.

Next, the device layer 112 and the insulating layer 113 are subjected to micromachining to form the target portions 101 and 102 to be inclined, i.e., the target portions 101 and 102 in a state before they are inclined.

Next, as shown in FIGS. 9C3 and 9D3, mask layers 163 are formed on the lower surface of the support layer 114 and through holes 121 are formed in the support layer 114.

Third Exemplary Embodiment

A third exemplary embodiment is described in connection with a method of fabricating a structure having inclined segments, which are angled at different angles outward of a plane parallel to a principal surface of a substrate on both upper and lower sides of the substrate. It is to be noted here that the "upper and lower sides of the substrate" means respectively the principal surface side (also called the front side) of the substrate and the other side (also called the rear side) of the substrate opposite to the principal surface.

Figure 10A:
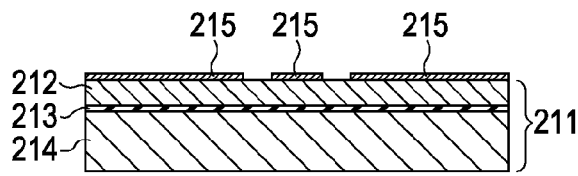
FIGS. 10A-10O are schematic views illustrating steps of a structure fabricating method according to a third exemplary embodiment of the present invention.
Figure 10E:
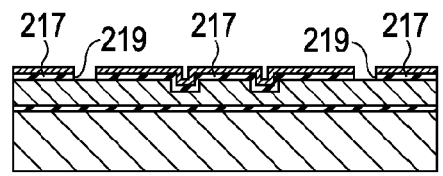
Figure 10B:
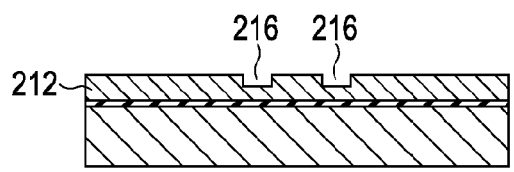
Figure 10F:
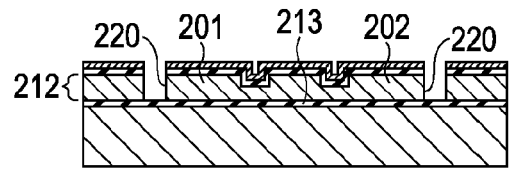
Figure 10C:
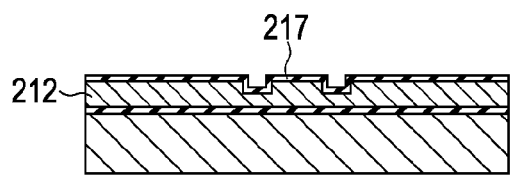
Figure 10G:
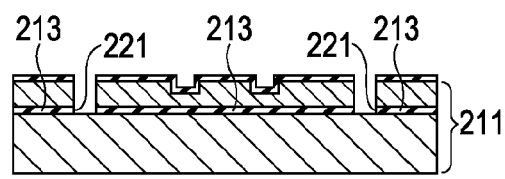
Figure 10D:
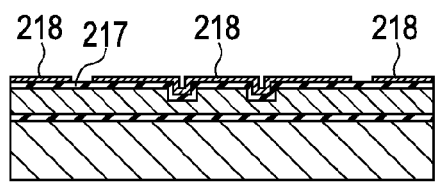
Figure 10H:
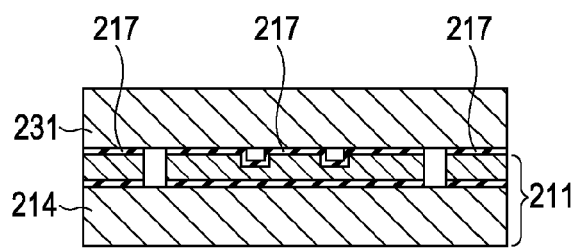
Figure 10I:
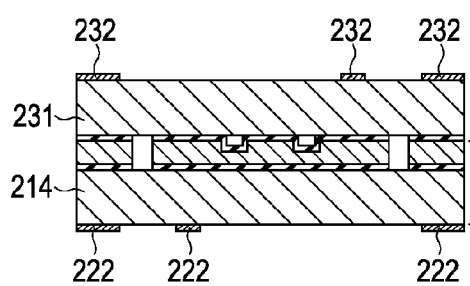
Figure 10M:
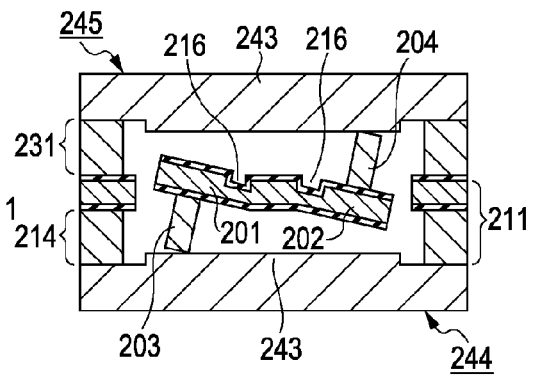
Figure 10J:
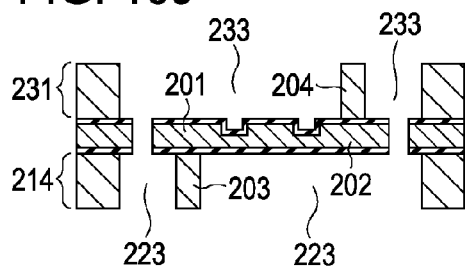
Figure 10N:
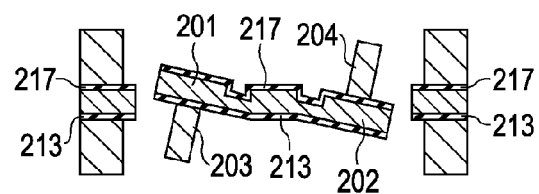
Figure 10K:
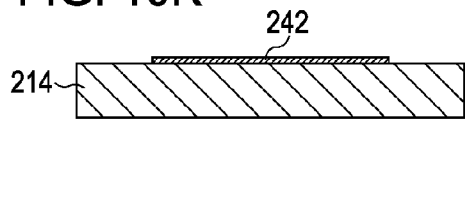
Figure 10O:
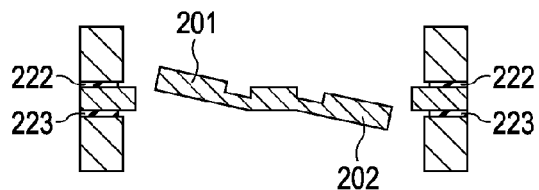
Figure 10L:
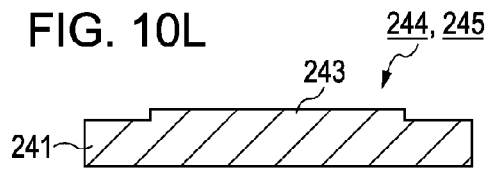

FIGS. 10A-10O are schematic views illustrating steps of the structure fabricating method according to the third exemplary embodiment.

FIGS. 10A-10O correspond respectively to steps (a) to (o).

First, target portions 201 and 202 to be inclined and projections 203 and 204 projecting respectively from the target portions 201 and 202 are formed through the following steps (a) to (j).

(a) A mask layer 215 is formed on the surface of a device layer 212 of a substrate 211.

The substrate 211 is a substrate having a three-layered structure (made of the device layer 212, an insulating layer 213, and the support layer 214) similarly to the substrate 111 used in the first exemplary embodiment. The substrate 211 can be constituted by, e.g., an SOI (Silicon On Insulator) substrate.

(b) Recesses 216 are formed in the device layer 212.

The depth of each recess 216 is set smaller than the thickness of the device layer 212.

(c) An insulating layer 217 is formed on the surface of the device layer 212.

The insulating layer 217 can be formed, for example, by vapor deposition of an insulating material such as silicon dioxide.

(d) A mask layer 218 is formed on an upper surface of the insulating layer 217.

(e) Through holes 219 are formed in the insulating layer 217.

For example, when the insulating layer 217 is made of silicon dioxide, the through hole 219 can be formed by a method of etching only the insulating layer 217 by using an etchant or etching gas, e.g., hydrofluoric acid or carbon tetrafluoride, which is able to selectively etch silicon dioxide.

(f) Through holes 220 are formed in the device layer 212 with the insulating layer 217 used as a mask.

(g) Through holes 221 are formed in the insulating layer 213 of the substrate 211.

(h) A substrate 231 is bonded to the upper surface of the insulating layer 217.

The substrate 231 is made of the same material as that of the support layer 214 of the substrate 211 having the three-layered structure. For example, when the SOI substrate is employed as the substrate 211, a substrate made of single-crystal silicon can be employed as the substrate 231.

Further, when a substrate made of single-crystal silicon is employed as the substrate 231, the substrate 231 can be bonded to the upper surface of the insulating layer 217 by anodic bonding.

(i) A mask layer 232 is formed on an upper surface of the substrate 231, and a mask layer 222 is formed on a lower surface of the support layer 214 of the substrate 211.

(j) Through holes 233 are formed in the substrate 231, and through holes 223 are formed in the support layer 214.

Next, dies 244 and 245 used for inclining the target portions 201 and 202 are fabricated through the following steps (k) and (l) (namely, two dies are fabricated in this exemplary embodiment).

(k) A mask layer 242 is formed on a substrate 241.

(l) A die projection 243 is formed on an upper surface of the substrate 241.

Finally, the target portions 201 and 202 are inclined to be properly angled relative to the horizontal, and the projections 203 and 204 of the target portions 201 and 202 are removed through the following steps (m) to (o).

(m) The recesses 216 in the device layer 212 of the substrate 211 are heated and the die 244 is pressed against the lower surface of the support layer 214 of the substrate 211 and against the projection 203 of the target portion 201. At the same time, the die 245 in an upside-down state is pressed against the upper surface of the substrate 231 and against the projection 204 of the target portion 202. As a result, the recesses 216 are plastically deformed.

The heating temperature and the heating method are substantially the same as those in the step (j) of the first exemplary embodiment, and a description thereof is not repeated here.

While two dies are used in the third exemplary embodiment to plastically deform the recesses 216 from both the sides outward of the support layer 114 and the substrate 231, the recesses can also be plastically deformed one by one on each side by using only one die.

(n) After cooling, the dies 244 and 245 are removed.

(o) The insulating layers 213 and 217 are removed except for portions denoted as insulating layers 224 and 234.

Because the projections 203 and 204 of the target portions 201 and 202 are fixed to the target portions 201 and 202 through only the insulating layers 213 and 217 interposed therebetween, respectively, the projections 203 and 204 of the target portions 201 and 202 are removed together with the insulating layers 213 and 217 in the step (o).

A method of removing the insulating layers 213 and 217 is substantially the same as that in the step (l) of the first exemplary embodiment, and a description thereof is not repeated here.

Figure 11:
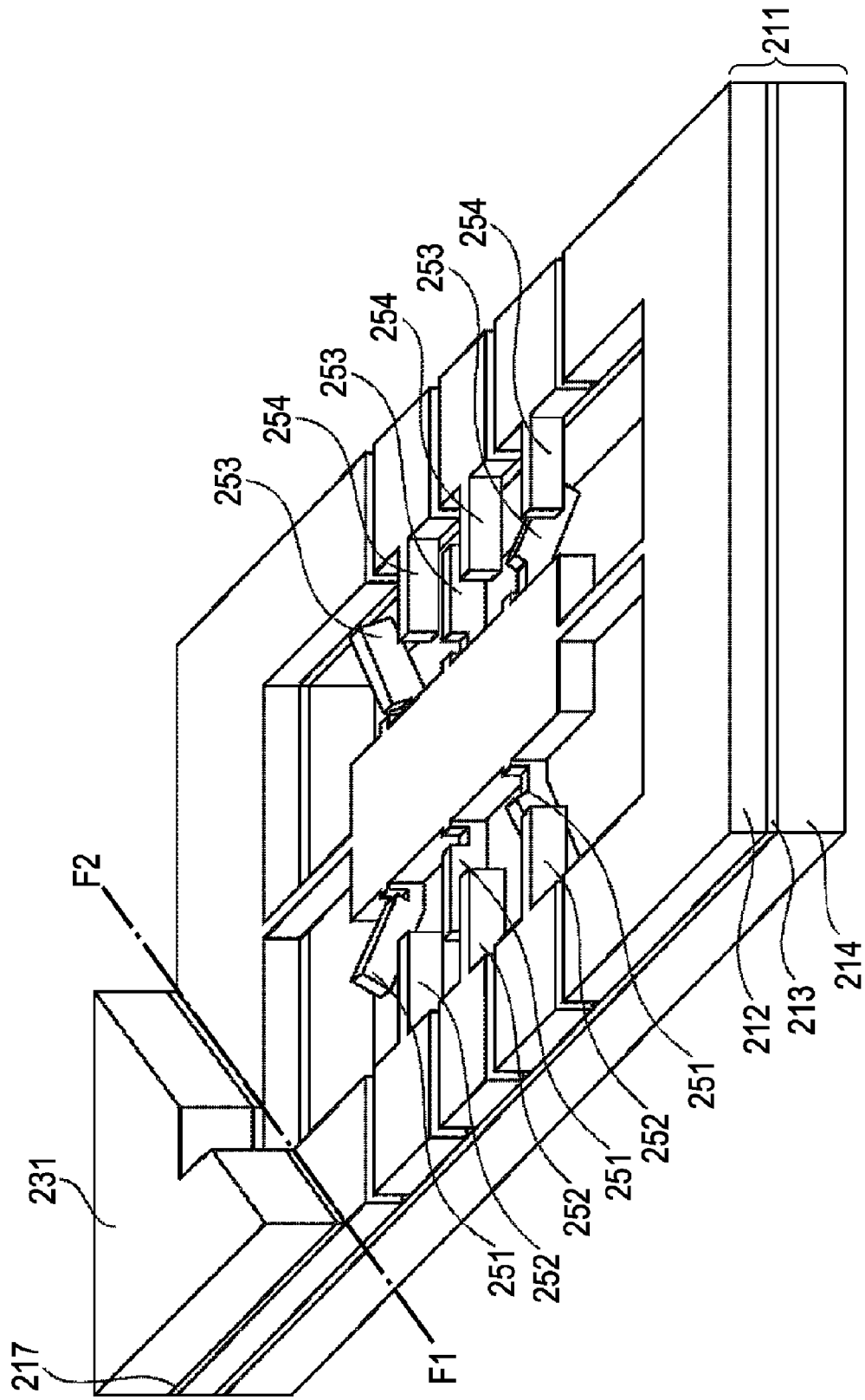
FIG. 11 is a perspective view illustrating one example of a structure fabricated by the structure fabricating method according to the third exemplary embodiment of the present invention.
Figure 12:
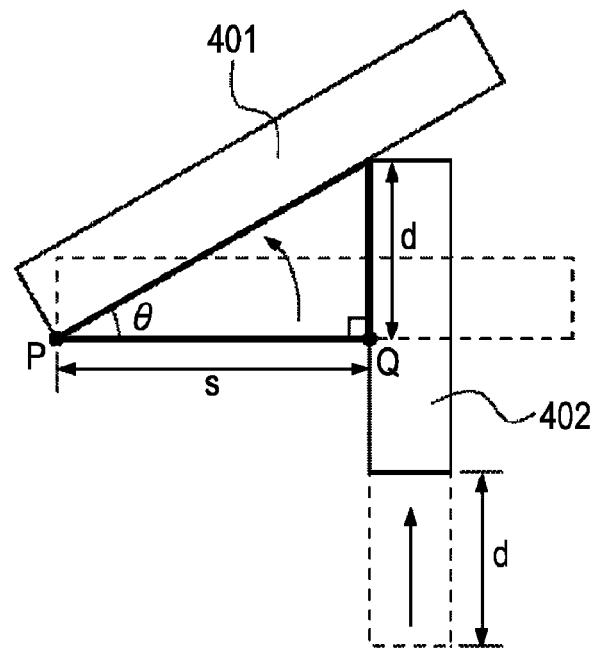
FIG. 12 is a schematic view illustrating components related to control of a bending angle of a target portion to be bent, when the structure fabricating method disclosed in U.S. Pat. No. 7,089,666, i.e., one of the known related art, is used.
Figure 13:
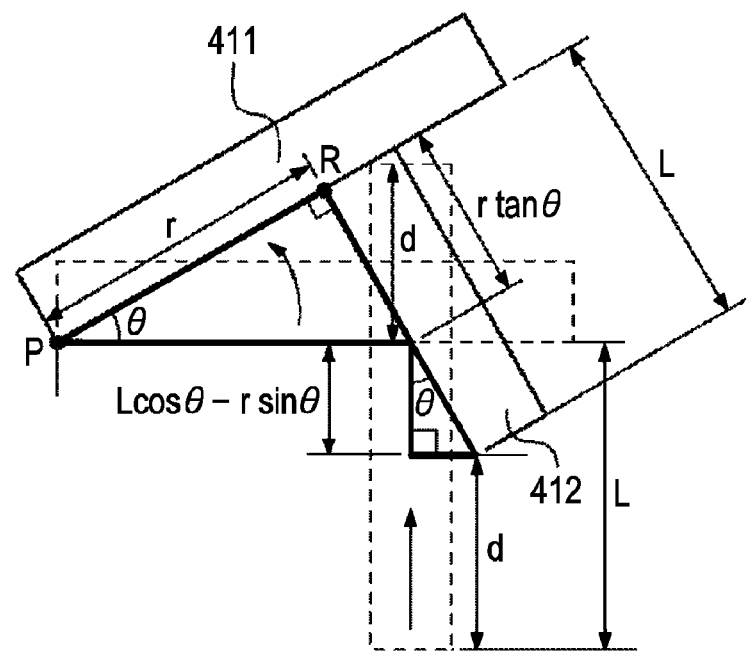
FIG. 13 is a schematic view illustrating components related to control of a bending angle of a target portion to be bent, when the structure fabricating method according to the present invention is used.
Figure 14A:
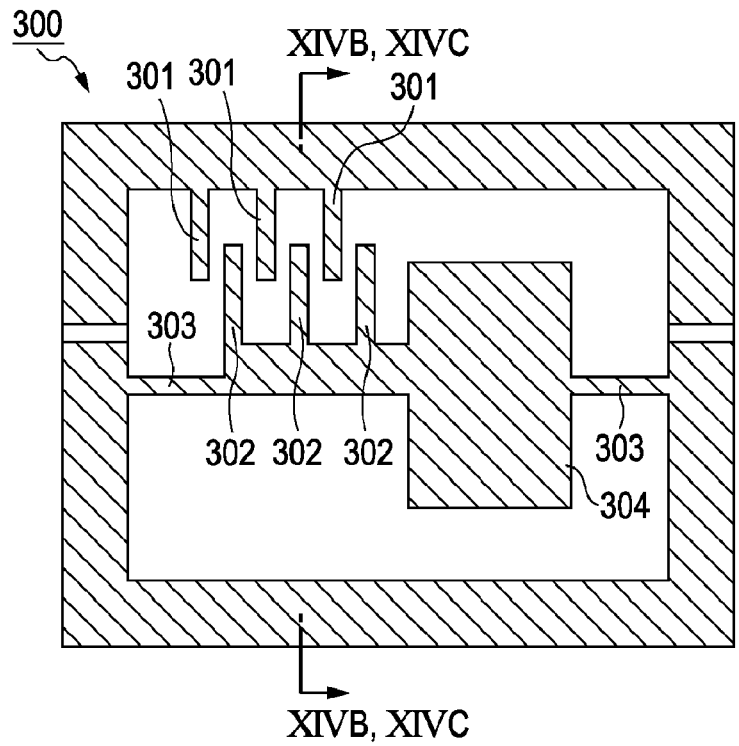
FIGS. 14A-14C are schematic views illustrating one example of an AVC structure.
Figure 14B:
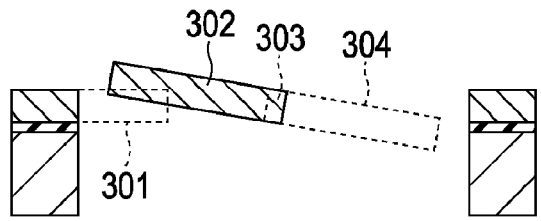
Figure 14C:
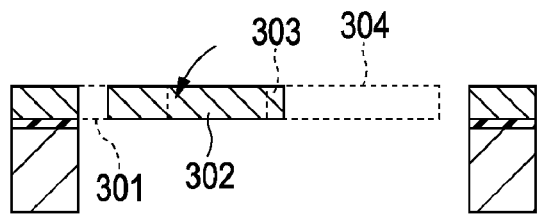
Figure 15A:
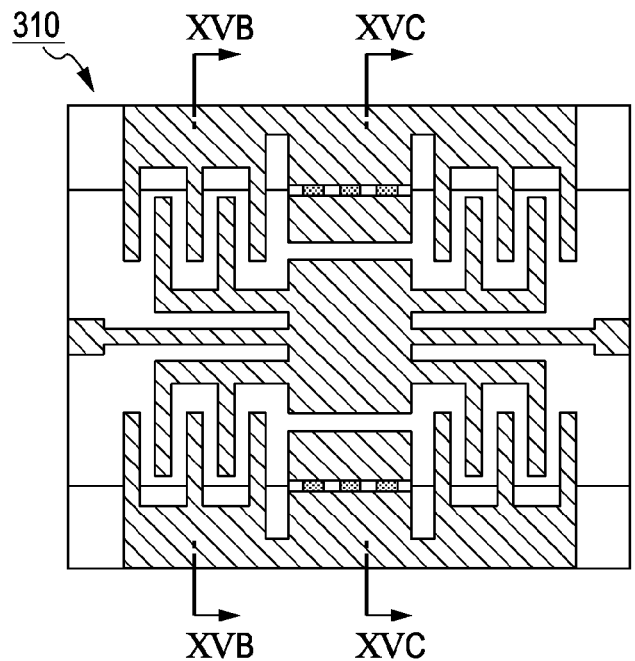
FIGS. 15A-15C are schematic views illustrating an AVC structure and a fabricating method thereof, which are disclosed in Japanese Patent Laid-Open No. 2004-219839 as another one of the known related art.
Figure 15B:
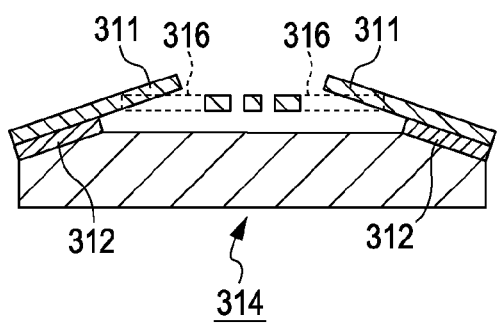
Figure 15C:
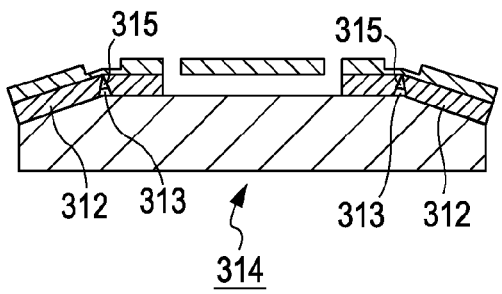
Figure 16A:
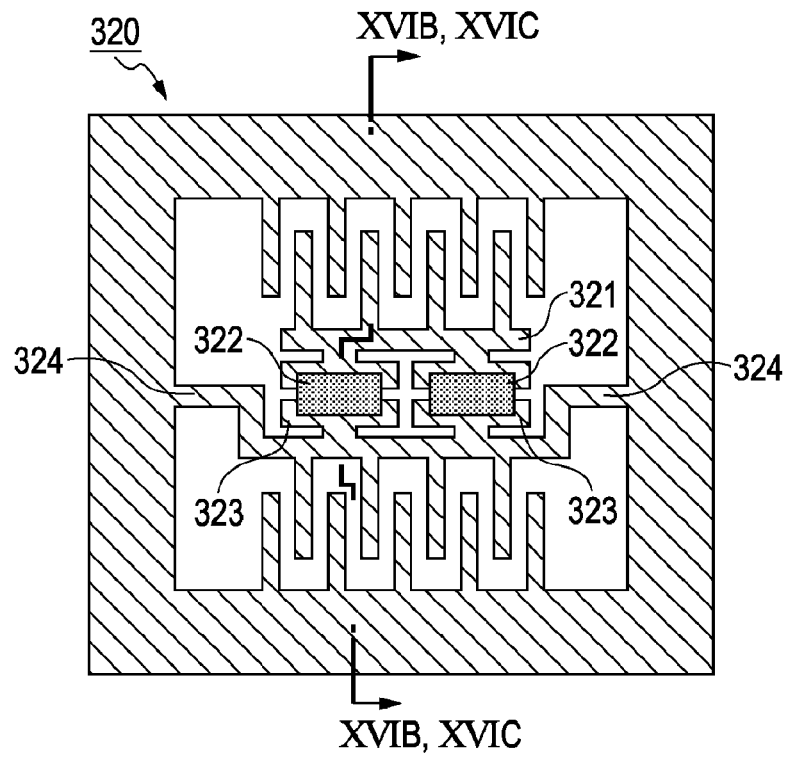
FIGS. 16A-16C are schematic views illustrating an AVC structure and a fabricating method thereof, which are disclosed in U.S. Pat. No. 7,085,122 as still another one of the known related art.
Figure 16B:
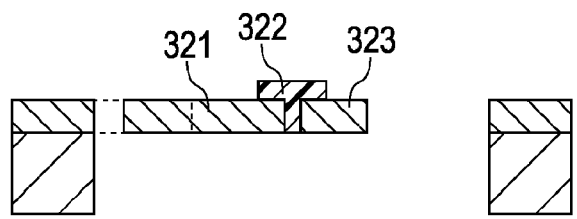
Figure 16C:
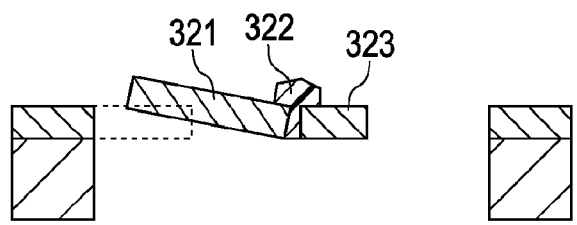
Figure 17A:
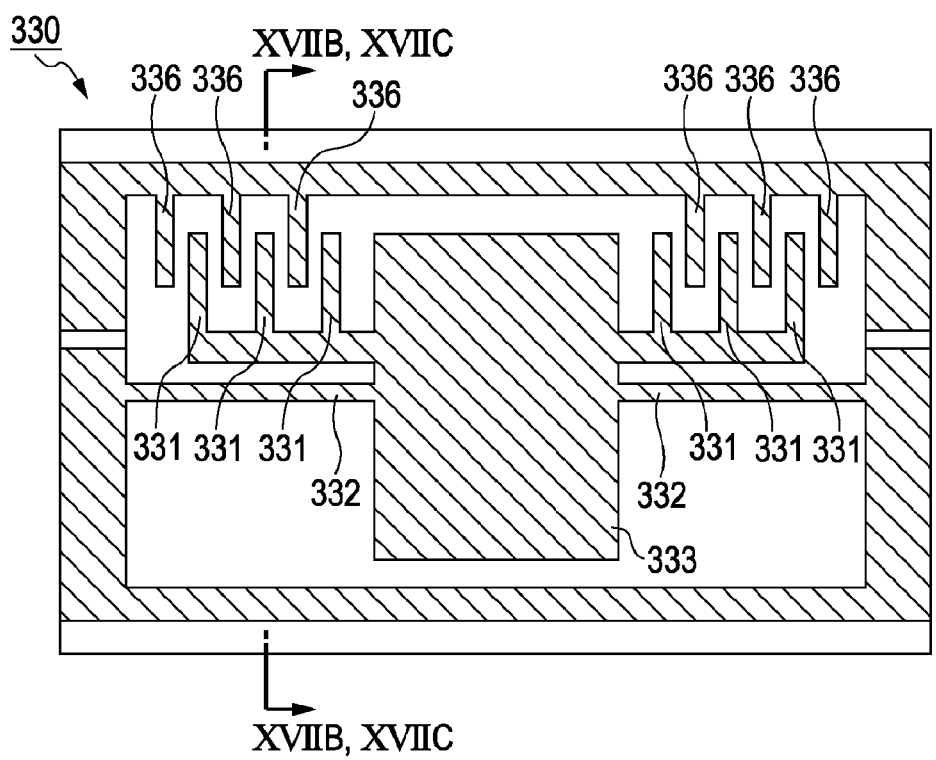
FIGS. 17A-17C are schematic views illustrating an AVC structure and a fabricating method thereof, which are disclosed in U.S. Pat. No. 7,089,666 as still another one of the known related art.
Figure 17B:
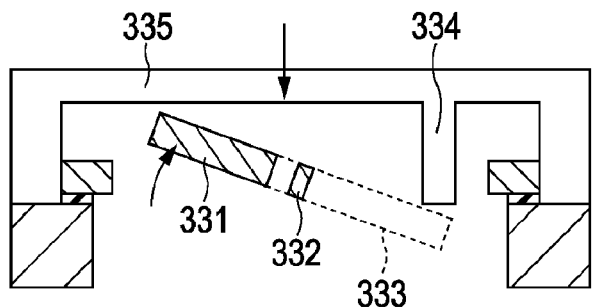
Figure 17C:
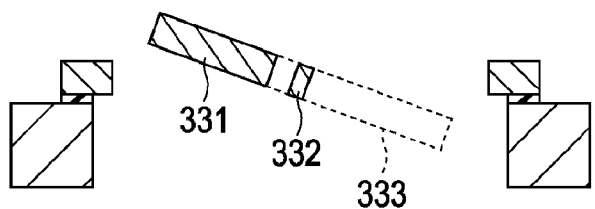

FIG. 11 illustrates one example of the structure fabricated by the fabricating method of the third exemplary embodiment (for easy understanding of the structure, the substrate 231 and the insulating layer 217 are shown as being cut along a vertical plane that passes a broken line F1-F2).

Specifically, FIG. 11 illustrates an AVC structure having a plurality of comb teeth 251, 252, 253 and 254. The plurality of comb teeth 251 and 253 are inclined upward and downward relative to the horizontal reference plane parallel to the principal surface of the substrate 211. According to the third exemplary embodiment, the structure having such a complicated shape can also be fabricated without the need for the alignment technique at high accuracy.

The fabricating method of the third exemplary embodiment can provide the following advantage in addition to the advantages stated in Summary of the Invention and the first and second exemplary embodiments.

A structural segment to be inclined can be inclined upward and downward relative to the horizontal reference plane parallel to the principal surface of a substrate. Therefore, flexibility in design of the elevation angle of each inclined segment can be further increased.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-098294 filed Apr. 4, 2007, which is hereby incorporated by reference herein in its entirety.

What is claimed is:

1. A structure fabricating method of plastically deforming a target portion of a substrate, to thereby fabricate a structure having an inclined segment that is inclined relative to a principal surface of the substrate, the method including:
    forming a projection on the target portion to project from the principal surface of the substrate or from an opposing surface of the substrate on the side opposite to the principal surface; and
    applying a force to the projection to plastically deform the target portion such that the target portion is bent in a direction from one surface of the substrate on the side where the projection is formed, toward another surface on the side opposite to the one surface,
    wherein the structure has at least two target portions, and
    wherein at least one of the projections formed on the target portions is provided on one of the principal surface of the substrate and the opposing surface of the substrate, and the remaining one or more projections are provided on the other of the two surfaces.

2. The structure fabricating method according to claim 1, wherein the structure has a target portion, and
    wherein the projection formed on the target portion is provided on one of the principal surface of the substrate and the opposing surface of the substrate.

3. The structure fabricating method according to claim 1, further including heating at least part of the target portion in the structure.

4. A structure fabricating method of plastically deforming a target portion of a substrate, to thereby fabricate a structure having an inclined segment that is inclined relative to a principal surface of the substrate, the method including:
    forming a projection on the target portion to project from the principal surface of the substrate or from an opposing surface of the substrate on the side opposite to the principal surface;
    applying a force to the projection to plastically deform the target portion such that the target portion is bent in a direction from one surface of the substrate on the side where the projection is formed, toward another surface on the side opposite to the one surface; and
    forming a recess in the target portion.

5. A structure fabricating method of plastically deforming a target portion of a substrate, to thereby fabricate a structure having an inclined segment that is inclined relative to a principal surface of the substrate, the method including:
    forming a projection on the target portion to project from the principal surface of the substrate or from an opposing surface of the substrate on the side opposite to the principal surface; and
    applying a force to the projection to plastically deform the target portion such that the target portion is bent in a direction from one surface of the substrate on the side where the projection is formed, toward another surface on the side opposite to the one surface,
    wherein the step of plastically deforming the target portion includes pressing a die against the structure and applying a force to the projection of the target portion.

6. The structure fabricating method according to claim 5, wherein the projection of the target portion is provided at a position corresponding to an angle by which a structural segment is to be inclined.

7. The structure fabricating method according to claim 5, wherein the projection of the target portion has a length corresponding to an angle by which a structural segment is to be inclined.

8. The structure fabricating method according to claim 4, wherein the structure has a target portion, and
    wherein the projection formed on the target portion is provided on one of the principal surface of the substrate and the opposing surface of the substrate.

9. The structure fabricating method according to claim 5, wherein the structure has a target portion, and
    wherein the projection formed on the target portion is provided on one of the principal surface of the substrate and the opposing surface of the substrate.

10. The structure fabricating method according to claim 4, further including heating at least part of the target portion in the structure.

11. The structure fabricating method according to claim 5, further including heating at least part of the target portion in the structure.

* * * * *